(12) United States Patent
Baldauf et al.

(10) Patent No.: US 8,941,187 B2
(45) Date of Patent: Jan. 27, 2015

(54) STRAIN ENGINEERING IN THREE-DIMENSIONAL TRANSISTORS BASED ON STRAINED ISOLATION MATERIAL

(75) Inventors: Tim Baldauf, Dresden (DE); Andy Wei, Queensbury, NY (US); Tom Herrmann, Dresden (DE); Stefan Flachowsky, Dresden (DE); Ralf Illgen, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 51 days.

(21) Appl. No.: 13/349,942

(22) Filed: Jan. 13, 2012

(65) Prior Publication Data

US 2013/0181299 A1   Jul. 18, 2013

(51) Int. Cl.
*H01L 27/088* (2006.01)

(52) U.S. Cl.
USPC ............. 257/401; 257/365; 257/E29.264; 438/142; 438/283

(58) Field of Classification Search
CPC .......... H01L 21/823431; H01L 21/823821; H01L 21/845; H01L 27/0886; H01L 27/0924; H01L 27/1211; H01L 29/41791; H01L 29/66772; H01L 29/66795; H01L 29/7831; H01L 29/785; H01L 2029/785; H01L 2029/7858; H01L 2924/13067; H01L 29/66545; H01L 29/7846
USPC .............. 257/E27.112, 347, E21.703, 401, 257/E29.137, E21.409, 288, E29.255, 365, 257/E29.264, E29.298, 368, 369; 438/142, 438/283
See application file for complete search history.

(56) References Cited

U.S. PATENT DOCUMENTS

| | | | |
|---|---|---|---|
| 2007/0052027 A1* | 3/2007 | Ke et al. ........................ 257/351 |
| 2007/0120156 A1* | 5/2007 | Liu et al. ....................... 257/288 |
| 2007/0190708 A1* | 8/2007 | Kaneko et al. ................ 438/157 |
| 2008/0277743 A1* | 11/2008 | Cho et al. ...................... 257/407 |
| 2008/0283906 A1* | 11/2008 | Bohr ............................. 257/327 |
| 2012/0276695 A1* | 11/2012 | Cheng et al. .................. 438/154 |

\* cited by examiner

*Primary Examiner* — Ermias Woldegeorgis
(74) *Attorney, Agent, or Firm* — Amerson Law Firm, PLLC

(57) ABSTRACT

In a three-dimensional transistor configuration, a strain-inducing isolation material is provided, at least in the drain and source areas, thereby inducing a strain, in particular at and in the vicinity of the PN junctions of the three-dimensional transistor. In this case, superior transistor performance may be achieved, while in some illustrative embodiments even the same type of internally stressed isolation material may result in superior transistor performance of P-channel transistors and N-channel transistors.

8 Claims, 14 Drawing Sheets

STRAIN ENGINEERING IN THREE-DIMENSIONAL TRANSISTORS BASED ON STRAINED ISOLATION MATERIAL

BACKGROUND OF THE INVENTION

1. Field of the Invention

Generally, the present disclosure relates to the fabrication of highly sophisticated integrated circuits including transistor elements having non-planar channel architecture.

2. Description of the Related Art

The fabrication of advanced integrated circuits, such as CPUs, storage devices, ASICs (application specific integrated circuits) and the like, requires the formation of a large number of circuit elements on a given chip area according to a specified circuit layout, wherein field effect transistors represent one important type of circuit element that substantially determines performance of the integrated circuits. Generally, a plurality of process technologies are currently practiced, wherein, for many types of complex circuitry including field effect transistors, MOS technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on, among other things, the dopant concentration, the mobility of the charge carriers and, for a planar transistor architecture, the distance between the source and drain regions, which is also referred to as channel length.

Presently, the vast majority of integrated circuits are formed on the basis of silicon due to its substantially unlimited availability, the well-understood characteristics of silicon and related materials and processes and the experience gathered during the past 50 years. Therefore, silicon will likely remain the material of choice for future circuit generations designed for mass products. One reason for the importance of silicon in fabricating semiconductor devices has been the superior characteristics of a silicon/silicon dioxide interface that allows reliable electrical insulation of different regions from each other. The silicon/silicon dioxide interface is stable at high temperatures and thus allows the performance of subsequent high temperature processes, as are required, for example, for anneal cycles to activate dopants and to cure crystal damage without sacrificing the electrical characteristics of the interface.

For the reasons pointed out above, in field effect transistors, silicon dioxide has been preferably used as a base material for gate insulation layers that separate the gate electrode, frequently comprised of polysilicon or other metal-containing materials, from the silicon channel region. In steadily improving device performance of field effect transistors, the length of the channel region has been continuously decreased to improve switching speed and drive current capability. Since the transistor performance is controlled by, among other things, the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length for a planar transistor configuration requires an increased capacitive coupling to avoid the so-called short channel behavior during transistor operation. The short channel behavior may lead to an increased leakage current and to a pronounced variance of the threshold voltage. Aggressively scaled planar transistor devices with a relatively low supply voltage and thus reduced threshold voltage may suffer from an exponential increase of the leakage current due to the required enhanced capacitive coupling of the gate electrode to the channel region. Thus, the thickness of the silicon dioxide layer has to be correspondingly reduced to provide the required capacitance between the gate and the channel region. For example, a channel length of approximately 0.08 µm may require a gate dielectric made of silicon dioxide as thin as approximately 1.2 nm.

For these reasons, a plurality of alternative approaches have been developed in an attempt to further enhance performance of planar transistors while avoiding the above-described problems. For instance, replacing silicon dioxide as material for gate insulation layers has been considered, particularly for extremely thin silicon dioxide gate layers. For example, dielectric material with significantly increased dielectric constant may be used, such as hafnium oxide and the like. Therefore, sophisticated approaches have been developed in order to provide gate electrode structures formed on the basis of superior gate dielectric materials, so-called high-k dielectric materials. In addition to the superior high-k dielectric materials, also metal-containing electrode materials are used in order to achieve enhanced overall conductivity of the gate electrode structures and provide efficient mechanisms for appropriately adjusting the work function for the various types of transistors. For example, the high-k dielectric material may be provided in an early manufacturing stage, i.e., upon patterning the gate electrode structure, or may be provided in a very advanced manufacturing stage, along with highly conductive electrode metals, by applying a so-called replacement gate approach. Although these approaches for providing sophisticated gate electrode structures contribute to significant enhancement of the performance characteristics of the transistors, there are still significant issues upon further scaling the overall dimensions of the transistors.

According to other strategies, performance of planar transistors may be efficiently increased by modifying the lattice structure in silicon-based semiconductor materials. As is well known, tensile or compressive strain may significantly change the charge carrier mobility in silicon-based semiconductor materials, thereby allowing significantly enhanced performance of planar transistors. For instance, for a standard crystallographic orientation of a silicon-based material, the generation of a tensile strain component along the current flow direction of the channel region of a planar transistor may significantly increase mobility of electrons and, thus, switching speed and drive current capability of the transistor may be increased. On the other hand, for the same standard crystallographic configuration, uniaxial compressive strain in the channel region may enhance mobility of holes, thereby providing the possibility of increasing performance of P-channel transistors. A corresponding strain component may be obtained by providing globally strained semiconductor materials in which corresponding active regions of transistors may be formed. In other well-established process techniques, the strain may be locally generated in the channel region of the transistors by implementing various strain-inducing mechanisms, such as incorporating a strain-inducing semiconductor material in the drain and source regions of N-channel transistors and/or P-channel transistors. For instance, providing a silicon/germanium alloy in the drain and source regions may result, due to the lattice mismatch between the silicon-based material and the silicon/germanium alloy, in a strained configuration, thereby inducing a substantially uniaxial compressive strain component, which may thus increase performance of P-channel transistors. Furthermore, other well-established strain-inducing mechanisms may be applied in the form of highly stressed materials positioned in close proximity to the transistors, thereby also inducing a desired strain component. For this purpose, the interlayer dielectric material provided in the contact level of the transistor elements may be used to induce a desired type of strain.

FIG. 1a schematically illustrates a perspective view of a sophisticated semiconductor device 100 comprising a planar transistor 150, which may be used in complex logic circuits, such as CPUs and the like, in order to obtain a high switching speed and the required drive current, as may be necessary for sophisticated applications. As illustrated, the conventional device 100 may comprise a substrate 101, such as a silicon substrate and the like, possibly in combination with a buried insulating layer 102, thereby providing a silicon-on-insulator (SOI) architecture, which may generally provide certain advantages in terms of switching speed and the like. Moreover, a silicon-based semiconductor layer 103 is formed on the buried insulating layer 102 and may comprise a plurality of "active" regions 103a which are laterally delineated by isolation structures, such as shallow trench isolations and the like. It should be appreciated that an active region is to be understood as a semiconductor region in which appropriate PN junctions are formed or are to be formed for at least one transistor element. In the example shown, the active region 103a comprises a source region 152s and a drain region 153d, which may represent highly doped semiconductor regions so as to provide a moderately high conductivity and to form a PN junction with a channel region 154 positioned between the source region 152s and the drain region 153d. In the case of a P-channel enrichment transistor, drain and source regions 153d, 152s may be P-doped, while the channel region 154 may be slightly N-doped. Thus, for achieving a high drive current of the transistor 150 in the case of a P-channel transistor, the channel region 154 has to be enriched with holes as charge carriers so as to enable a P-conductive path from the source region 152s to the drain region 153d. For an N-channel transistor, inversely doped drain and source regions and a channel region has to be provided. Furthermore, the transistor 150 comprises a gate electrode structure 151, which may comprise an electrode material 151a that is formed on a gate dielectric material 151b, which thus separates the electrode material 151a from the channel region 154. Furthermore, frequently, a spacer structure 151c may be formed on sidewalls of the electrode material 151a, wherein, for convenience, the spacers 151c are illustrated so as to be transparent in order to not unduly obscure the illustration of the transistor 150.

The interface between the channel region 154 and the gate dielectric material 151b may substantially determine the electronic characteristics of the transistor 150, wherein this interface is provided within a single plane so that the transistor 150 may be considered as a planar transistor device. As previously explained, one important parameter of the transistor 150 is represented by the length of the gate electrode structure 151, which may be understood as the horizontal extension of the electrode material 151a. For instance, in sophisticated applications, the gate length is approximately 50 nm and less, which may thus require a high capacitive coupling of the electrode material 151a to the channel region 154 via the gate dielectric material 151b. Consequently, the thickness and/or the material composition of the gate dielectric material 151b have to be appropriately selected in order to provide the desired capacitive coupling. Furthermore, the overall drive current of the transistor 150 is also determined by the transistor width, since the width determines the total area available for the charge carrier transport.

Due to the limitations with respect to leakage currents of gate dielectric material and due to the complexity of patterning gate electrode structures and active regions for achieving the required high drive current capability in combination with a high switching speed, additional mechanisms have been implemented in order to create a desired type of strain 156 in the channel region 154. For example, a strain-inducing semiconductor alloy 155 may be incorporated into the drain and source regions 152s, 153d which may have a strained state and which may thus induce the strain 156. Additionally or alternatively to the strain-inducing material 155, the spacer structure 151c may be provided as a highly stressed dielectric material and/or a further material may be formed on the drain and source regions 152s, 153d in a highly stressed state, thereby also inducing a certain degree of strain in the channel region 154. Although these mechanisms may provide significant enhancement of transistor performance for a given geometric configuration of the transistor 150, upon further device scaling, i.e., upon further reducing the length of the gate electrode structure 151, the efficiency of these mechanisms may significantly decrease, thereby resulting in a less pronounced performance gain.

For these reasons, alternative transistor architectures have been proposed, such as "three-dimensional" architectures, in which a desired channel width and thus transistor width may be obtained at reduced overall lateral dimensions, while at the same time superior controllability of the current flow through the channel region may be achieved. To this end, so-called FinFETs have been proposed in which a thin sliver or fin of silicon may be formed in a thin layer of a semiconductor material, wherein at least on both sidewalls of the fin and possibly on a top surface thereof, a gate dielectric material and a gate electrode material may be provided, thereby realizing a double gate or tri-gate transistor whose channel region may be fully depleted. Typically, in sophisticated applications, the width of the silicon fins may be on the order of magnitude of 10-20 nm and the height thereof may be on the order of magnitude of 30-40 nm.

Thus, FinFET transistor architectures may provide advantages with respect to increasing the effective coupling of the gate electrode to the various channel regions without requiring a corresponding reduction in thickness of the gate dielectric material. Moreover, by providing this non-planar transistor architecture, the effective channel width may also be increased so that, for given overall lateral dimensions of a transistor, an enhanced current drive may be obtained.

FIG. 1b schematically illustrates a perspective view of the semiconductor device 100 which comprises a FinFET transistor 120, which is to represent any three-dimensional or "vertical" transistor architecture. As illustrated, the device comprises the substrate 101 and the "buried" insulating layer 102 on which are formed a plurality of semiconductor fins 110, which may thus represent the "residues" of a portion of the semiconductor layer 103 (FIG. 1a). Moreover, a gate electrode structure 130 may be formed adjacent to a central portion of the semiconductor fins 110 so as to define corresponding channel regions therein. It should be appreciated that the gate electrode structure 130 may comprise a gate dielectric material formed on sidewalls 110a, 110b of the semiconductor fins 110 and also typically on a top surface 110s of the fins 110. In this case, the sidewalls 110a, 110b and the top surface 110s may represent the actual control areas for controlling a current flow through the semiconductor fins 110 so that sometimes this transistor structure is referred to as a tri-gate configuration. Consequently, each of the fins 110 may comprise a source region 122 and a drain region 123 which may represent respective end portions of the fins 110 and which may thus have an appropriate dopant concentration in order to form corresponding PN junctions with the channel region, which is covered by the gate electrode structure 130. Consequently, the semiconductor fins 110 may enable a controlled current flow along a length direction 110l, wherein the current flow may be controlled by the gate electrode structure 130. For this purpose, a height 110h and a width 110w of the fins 110 may be appropriately selected in combination with the characteristics of the gate electrode structure 130 so as to obtain a reliable control of the current flow. As previously discussed, for given lateral dimensions of the transistor 120, a significantly increased overall drive current may be obtained, while patterning of the gate electrode structure 130 may be less critical, for instance with respect to a thickness of a gate dielectric material.

Typically, the semiconductor device 100 comprising the three-dimensional transistor 120 may be formed on the basis of appropriate patterning techniques in which the semiconductor fins 110 may be formed on the basis of sophisticated lithography and etch techniques in order to etch through the initial semiconductor layer 103 (FIG. 1a), while using the buried insulating layer 102 as an etch stop material, or forming recesses of a desired depth into the semiconductor material, if a bulk architecture is considered. Thereafter, the gate electrode structure is formed, for instance, by adding a desired gate dielectric material, such as a silicon oxide-based material, which may be accomplished by oxidation and/or deposition, followed by the deposition of an electrode material, such as polysilicon and the like. After providing the gate layer stack, appropriate lithography and etch techniques may be applied in order to form the gate electrode structure 130 having a desired "gate length," indicated as 130l. Thus, a desired short gate length may be obtained wherein, nevertheless, superior controllability is achieved since the gate control voltage may be applied from both sidewalls 110a, 110b and the top surface 110s, contrary to the planar transistor 150 as illustrated in FIG. 1a. The drain and source regions 122, 123 may be formed on the basis of ion implantation processes and the like in accordance with any appropriate process strategy.

In order to further enhance performance of the transistor 120, it has been proposed to also apply strain-inducing mechanisms, similar as described with reference to the planar transistor 150 of FIG. 1a. In view of further device scaling, however, many of these strain-inducing mechanisms are considered as less efficient, such as stressed spacers and stressed overlayers. With respect to device generations using transistors having critical dimensions of 30 nm and less, in particular the incorporation of a strain-inducing semiconductor material, such as a silicon/germanium alloy, into the drain and source areas is considered most promising in view of achieving a gain in performance of three-dimensional transistor architectures. Other strain-inducing mechanisms that are considered as potential candidates with respect to three-dimensional transistors are providing metal gate electrode structures in which the metal material may be provided with a high internal stress level, while, in other cases, globally strained base semiconductor materials are considered as representing promising strain-inducing mechanisms. However, the latter candidates for a strain-inducing mechanism, i.e., globally strained semiconductor layers and metal gate electrode structures, are presently not fully understood with respect to their effect on actual transistor architectures. On the other hand, the strain-inducing mechanism based on silicon/germanium, as is well established for planar transistors, is believed to provide superior performance for P-channel transistors only, thereby only partially contributing to transistor performance in CMOS devices. Since, generally, strain-inducing mechanisms are considered as promising approaches for further enhancing overall performance of complex transistor architectures, possibly in combination with the introduction of sophisticated high-k metal gate electrode structures, the present disclosure relates to manufacturing techniques and semiconductor devices in which transistor performance may be enhanced on the basis of a strain-inducing mechanism in semiconductor devices including three-dimensional transistor architectures, possibly in combination with planar transistors, while avoiding or at least reducing the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides manufacturing techniques and semiconductor devices in which an efficient strain-inducing mechanism may be implemented into a transistor configuration, which at least partially is to be considered as a three-dimensional architecture. In this respect, it has been recognized that, in particular, the drain and source areas of a transistor may be provided as a plurality of three-dimensional semiconductor bodies so as to provide sidewall surface areas which may be available for receiving strain forces applied by an appropriate isolation material, such as a highly stressed dielectric material. In some illustrative aspects disclosed herein, the entire transistor architecture may be provided in the form of a three-dimensional configuration in which one or more elongated semiconductor bodies may be provided as a continuous semiconductor material, thereby providing a FinFET configuration or a tri-gate architecture, as discussed above, wherein the elongated semiconductor bodies may be laterally embedded, at least in the drain and source areas, in a strain-inducing isolation material, thereby providing superior strain conditions, wherein it has been recognized that, in particular, a strain component perpendicular to the length direction of the elongated semiconductor bodies and near the corresponding PN junctions of the drain and source areas may significantly contribute to superior transistor characteristics.

One illustrative method disclosed herein comprises forming one or more semiconductor fins in a drain area and a source area of a semiconductor region of a transistor, wherein the drain area and the source area are laterally separated by a channel area. Furthermore, the semiconductor fins are elongated along a length direction and have sidewalls and a top surface. The method further comprises forming a strain-inducing isolation material laterally adjacent to at least a portion of sidewalls of the one or more semiconductor fins, wherein the isolation material induces a strain in the semiconductor fins in the drain and source area perpendicular to the length direction. The method additionally comprises forming a gate electrode structure on the channel area.

A further illustrative method disclosed herein relates to forming a semiconductor device. The method comprises forming an elongated semiconductor body above the substrate, wherein the elongated semiconductor body has sidewalls and a top surface. Moreover, the method comprises forming a drain region of a transistor in a first portion of the elongated semiconductor body. Furthermore, a source region of the transistor is formed in a second portion of the elongated semiconductor body. The method additionally comprises forming a gate electrode structure of the transistor adjacent to a third portion of the elongated semiconductor body, wherein the gate electrode structure is configured to control a current flow in the third portion along the length direction. Moreover, the method comprises forming a strain-inducing isolation material laterally adjacent to the sidewalls of the first and second portions so as to induce strain in the drain and source regions.

One illustrative semiconductor device disclosed herein comprises a first plurality of elongated semiconductor bodies, each of which is a portion of a drain region of a transistor and each of which has sidewalls and a top surface. The semiconductor device further comprises a second plurality of elongated semiconductor bodies, each of which is a portion of a source region of the transistor and each of which has sidewalls and a top surface. The semiconductor device further comprises a channel region positioned between the drain region and the source region. Furthermore, a gate electrode structure is formed adjacent to the channel region and is configured to control a current flow through the channel region. Furthermore, the semiconductor device comprises a strain-inducing isolation material formed laterally between the first and second pluralities of elongated semiconductor bodies.

BRIEF DESCRIPTION OF THE DRAWINGS

The disclosure may be understood by reference to the following description taken in conjunction with the accompanying drawings, in which like reference numerals identify like elements, and in which.

Figure 1A:
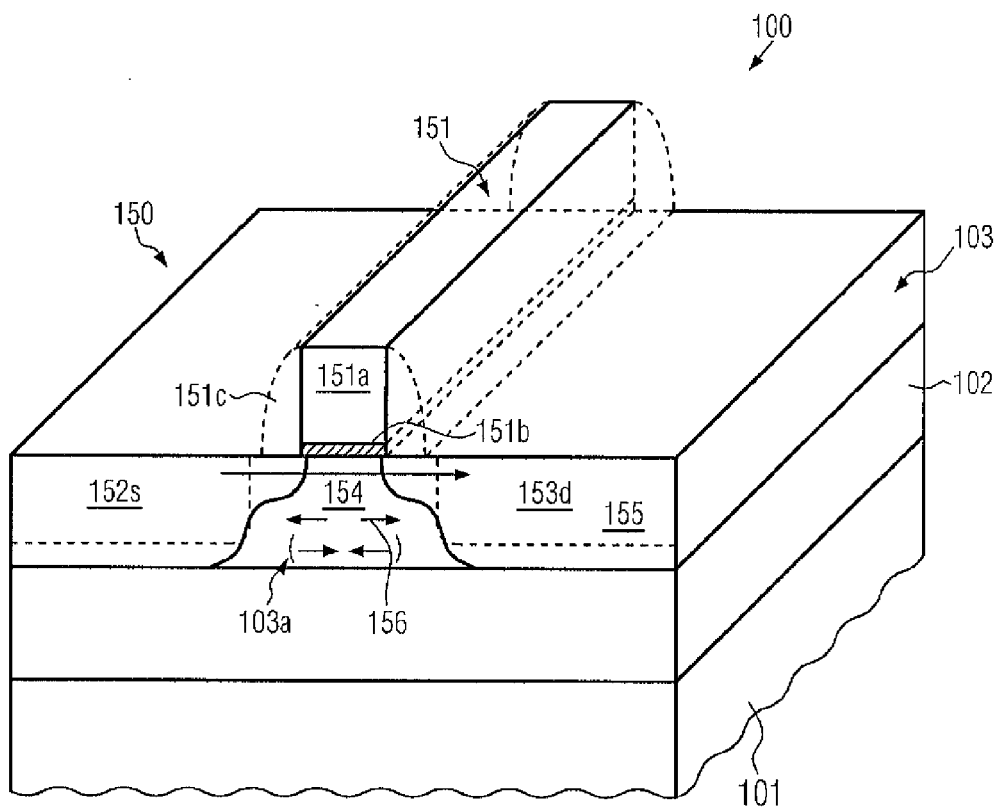
FIG. 1a schematically illustrates a perspective view of a planar transistor including a strain-inducing mechanism.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally provides non-planar transistor architectures in which superior strain conditions may be obtained by providing strain-inducing isolation materials adjacent to elongated semiconductor bodies or semiconductor fins which are provided at least in a portion of the drain and source areas of the transistor. In this manner, in particular, portions of exposed sidewall areas of the elongated semiconductor bodies are available for interacting with the highly stressed isolation material, wherein it has been recognized that the resulting strain component in a direction that is substantially perpendicular to the length direction of the semiconductor fins may contribute to superior transistor characteristics. In some illustrative embodiments, the three-dimensional architecture of a transistor may be provided selectively in the drain and source areas, while a channel area positioned laterally between the drain area and the source area may not necessarily have a three-dimensional architecture. Also in this case, the increased surface area in the drain and source areas with respect to an interaction with a highly stressed isolation material may nevertheless provide superior strain conditions since, in particular, at and in the vicinity of the corresponding PN junctions, a performance enhancing strain component may be generated. In other illustrative embodiments, generally a three-dimensional transistor architecture may be provided in which the channel region and at least a portion of the drain and source areas may be provided as one or more elongated semiconductor bodies or semiconductor fins, wherein, also in this case, the strain-inducing isolation material in the drain and source areas may provide superior strain conditions.

Consequently, by providing the strain-inducing isolation material laterally adjacent to sidewalls of semiconductor fins, at least in the drain and source areas, an appropriate strain-inducing mechanism has been identified, which is highly compatible with any process technology for forming three-dimensional transistors. Furthermore, the strain-inducing mechanism on the basis of the stressed isolation material may also be implemented into any manufacturing regime in which planar transistors and three-dimensional transistors have to be provided concurrently, depending on the overall device and design requirements.

With reference to FIGS. 2a-2l, 3a-3f and 4-6, further illustrative embodiments will now be described in more detail, wherein reference also may be made to FIGS. a and 1b, if necessary.

Figure 2A:
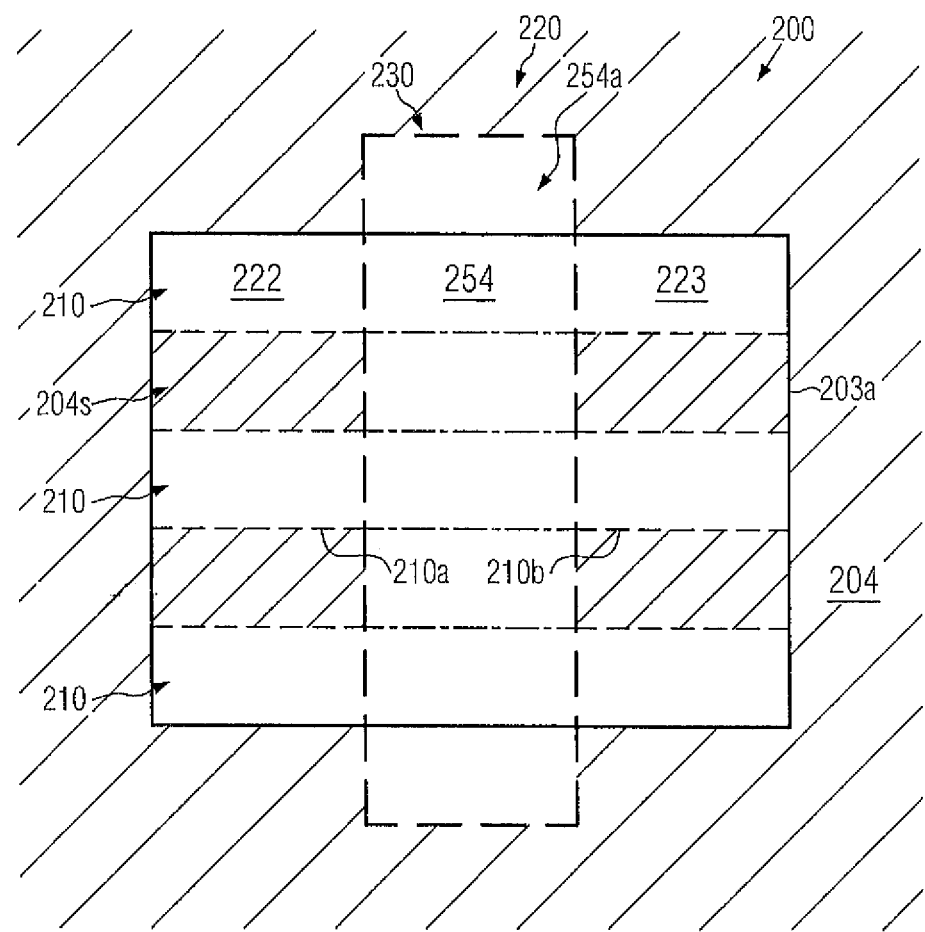
FIG. 2a schematically illustrates a top view of a semiconductor device comprising a transistor having, at least in the drain and source areas, a three-dimensional device architecture with a strain-inducing isolation material acting on the three-dimensional device architecture, according to illustrative embodiments.

FIG. 2a schematically illustrates a top view of a semiconductor device 200, which may comprise a transistor 220, which may comprise a drain area 222 and a source area 223, which are laterally separated by a channel area 254a. It should be appreciated that the transistor 220 is to be considered as a three-dimensional transistor in the sense that at least a portion of the drain and source areas 222, 223 is provided in the form of semiconductor regions 210, which have, within an active region 203a of the transistor 220, intermediate or inner sidewall surface areas 210a, 210b, respectively, which are in contact or are formed adjacent to an isolation material 204s, which may be provided as a highly stressed material in order to interact with the semiconductor regions 210 via the sidewall surface areas 210a, 210b in order to induce appropriate strain conditions in the semiconductor regions 210 within the drain and source areas 222, 223 and thus also influencing the current flow behavior in a channel region 254, which is provided in the channel area 254a.

Figure 1B:
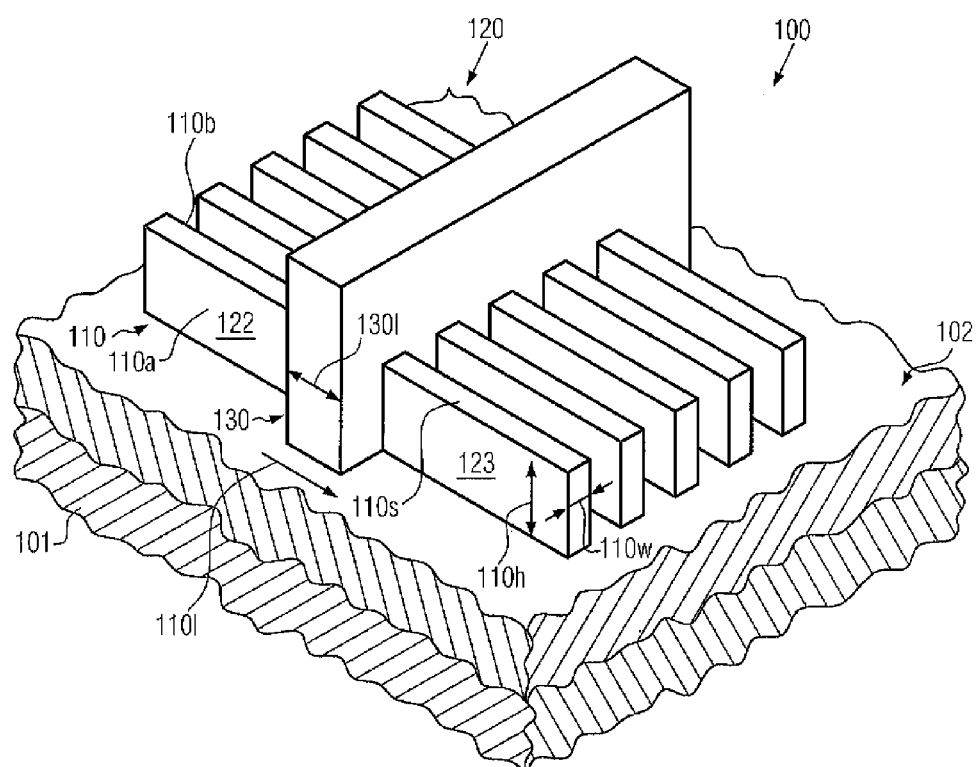
FIG. 1b schematically illustrates a perspective view of a three-dimensional transistor, such as a tri-gate transistor, comprising a plurality of semiconductor fins or elongated semiconductor bodies, of a conventional three-dimensional transistor architecture.

In other illustrative embodiments, the three-dimensional architecture is also provided in the channel area 254a, wherein the channel region 254 may have corresponding sidewall surface areas and a top surface for controlling a current flow within the channel area 254a between the drain and source areas 222, 223, as is also discussed above with reference to the semiconductor device 100 illustrated in FIG. 1b. For example, the semiconductor regions 210 may be understood as elongated semiconductor bodies or semiconductor fins, which may extend from the drain area 222 into the source area 223 as a continuous semiconductor fin, thereby also being provided in the channel area 254a. In other cases, the semiconductor bodies 210 may be provided in the drain and source areas 222, 223, respectively, without having a "fin geometry" in the channel area 254a, so that the channel region 254 may be provided as a single surface area, as, for instance, previously discussed with reference to the planar transistor of FIG. 1a.

Furthermore, the transistor 220 may comprise a gate electrode structure 230 which may be formed at least on the channel area 254a and thus on the channel region 254, wherein it should be understood that the gate electrode structure 230 may actually extend beyond the actual channel area 254a, for instance due to the provision of any sidewall spacer structure (not shown) and the like. Furthermore, it should be understood that the actual channel region 254 is basically determined by the dopant profile in the drain and source areas 222, 223, which may extend below the gate electrode structure 230, which is also previously illustrated with reference to FIG. 1a.

Figure 2B:
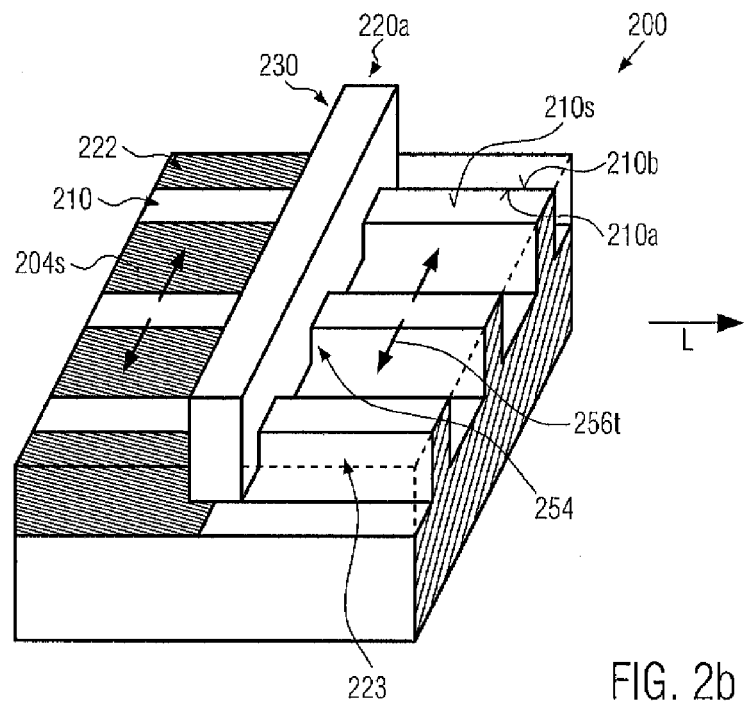
FIGS. 2b and 2c schematically illustrate perspective views of three-dimensional transistors in the form of tri-gate transistors with semiconductor fins that are laterally embedded in a strain-inducing isolation material, according to further illustrative embodiments.

FIG. 2b schematically illustrates a perspective view of the semiconductor device 200 wherein a three-dimensional transistor 220a is illustrated so as to comprise a plurality of the elongated semiconductor regions 210 in the form of continuous semiconductor fins, as is also discussed above, wherein the gate electrode structure 230 is formed above a central portion of the semiconductor fins 210, thereby covering a portion of a top surface 210s and portions of the sidewall surface areas 210a, 210b. In this case, a tri-gate architecture is provided on the basis of the semiconductor fins 210 and the gate electrode structure 230, as for instance also discussed above with reference to the semiconductor device 100 of FIG. 1b. Furthermore, in the drain area and the source area 222, 223, the strain-inducing isolation material 204s may be provided so as to laterally enclose the semiconductor fins 210 and thus act on portions of the sidewall areas 210a, 210b, which are not covered by the gate electrode structure 230. It should be appreciated that, for a better 3-dimensional illustration, at the source side 223, the isolation material 204s is shown as a "transparent" material.

In the embodiment shown in FIG. 2b, the isolation material 204s is provided so as to induce a tensile strain component 256t in the semiconductor fins 210, wherein the essential component of the tensile strain may act in a direction that is substantially perpendicular to a length direction, indicated as L, of the semiconductor fins 210. As will be discussed later on in more detail, the strain component 256t may result in superior transistor characteristics, even if the channel region 254 may not directly interact with the strain-inducing isolation material 204s. The material 204s may be provided in the form of a stressed dielectric material, such as silicon dioxide, silicon nitride, silicon oxynitride, nitrogen-containing silicon carbide, depending on the availability of deposition regimes and material resources for providing the material 204s with a desired high internal stress, while nevertheless achieving the desired fill behavior upon forming the material 204s between the semiconductor fins 210 in the drain and source areas 222, 223. It should be appreciated that moderately high stress levels may be achieved upon forming well-established dielectric materials, such as silicon nitride, silicon dioxide and the like. Furthermore, in some illustrative embodiments (not shown), other strain-inducing materials, such as metal-containing materials in the form of titanium nitride and the like, may be used, which are known to allow a material deposition with high internal stress levels, wherein an appropriate configuration may be established so as to comply with the conductivity requirements in the drain and source areas 222, 223.

Figure 2C:
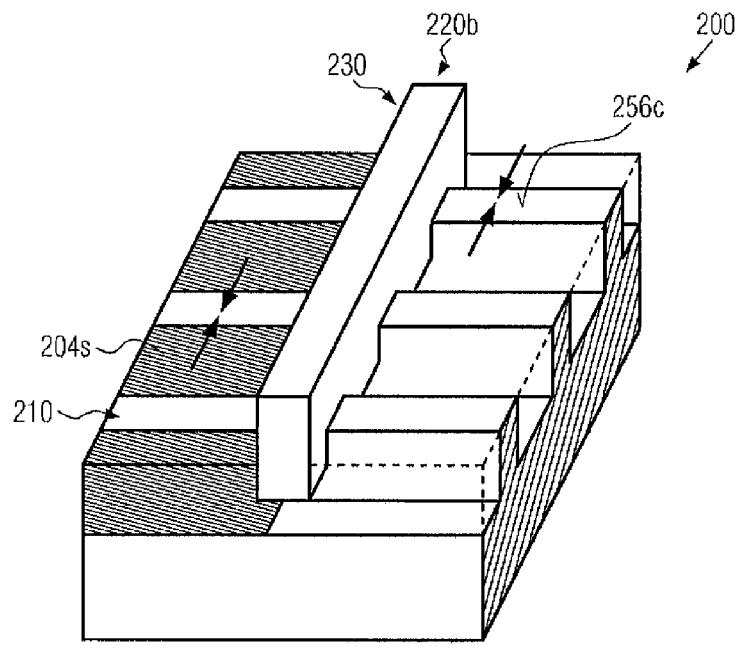

FIG. 2c schematically illustrates the semiconductor device 200 according to further illustrative embodiments in which a second transistor 220b may be provided, which may also have a configuration as discussed above with reference to the transistor 220 (FIG. 2a) and the transistor 220a (FIG. 2b), wherein the isolation material 204s may be provided so as to have a different amount or type of internal stress level, for instance in the form of a compressive stress 256c, if the stress 256c is considered appropriate for enhancing performance of the transistor 220b. It should be appreciated that the transistors 220a, 220b as shown in FIGS. 2b and 2c may be provided concurrently in the device 200 in order to allow the individual adjustment of the transistor characteristics on the basis of the material 204s having different stress characteristics.

Basically, the transistors 220, 220a, 220b as illustrated with reference to FIGS. 2a-2c may be formed on the basis of any appropriate manufacturing strategy, for instance on the basis of process techniques as described above with reference to FIG. 1b, wherein, however, at any appropriate manufacturing stage, the isolation material 204s may be provided with the desired internal stress level. If different stress characteristics are required in the isolation materials 204s, as discussed above with reference to the devices 220a, 220b, an appropriate masking and deposition regime may be applied in order to provide the material 204s with locally differing stress characteristics.

With reference to FIGS. 2d-2l, some illustrative manufacturing strategies will now be described in order to provide a three-dimensional transistor architecture, at least in the drain and source areas, in combination with a strain-inducing isolation material.

Figure 2D:
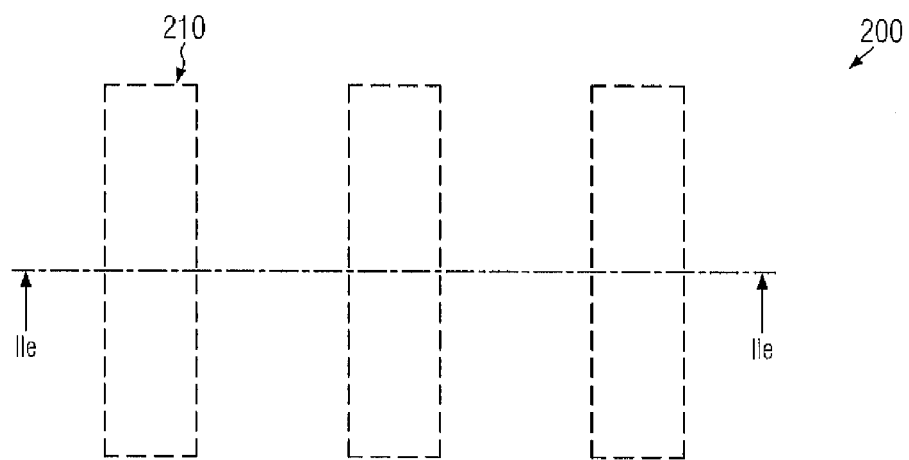
FIGS. 2d-2i schematically illustrate top views and cross-sectional views, respectively, of a semiconductor device during various manufacturing stages when forming a transistor having a three-dimensional architecture with a strain-inducing mechanism based on a strain-inducing isolation material, according to still further illustrative embodiments.

FIG. 2d schematically illustrates a top view of the semiconductor device 200 in an early manufacturing stage, wherein the lateral size and position of the semiconductor fins or elongated semiconductor bodies 210 is indicated and is to be implemented in an early manufacturing stage. In the embodiment shown, the semiconductor fins 210 may represent continuous semiconductor fins, wherein a central portion thereof may act as a channel area and may receive thereon a gate electrode structure, as is discussed above.

Figure 2E:
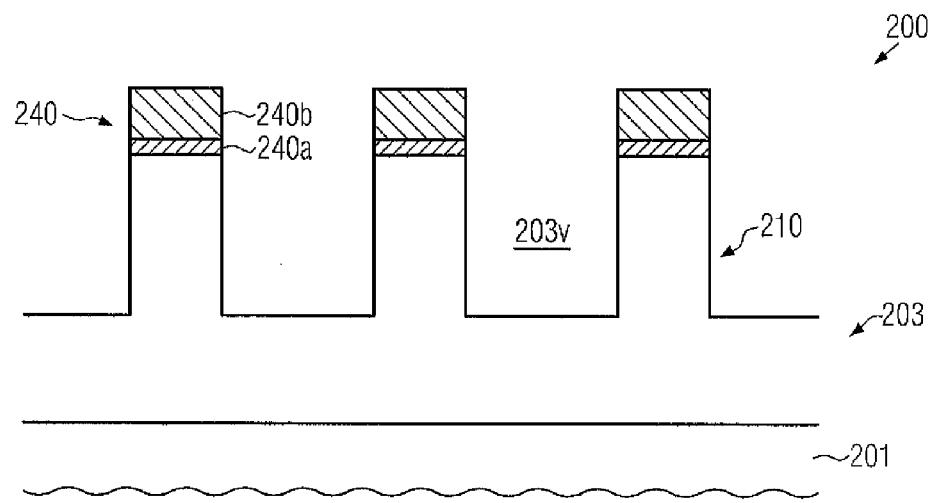

FIG. 2e schematically illustrates a cross-sectional view of the semiconductor device 200 along the section IIe of FIG. 2d. As illustrated, the semiconductor fins 210 may be formed in a semiconductor layer 203, which in turn may be provided above a substrate 201, such as a semiconductor substrate and the like. It should be appreciated that, in other illustrative embodiments (not shown), the layer 203 may actually represent a dielectric material such as a silicon dioxide material and the like when an SOI architecture is considered, as is, for instance, discussed above with reference to the device 100 of FIG. 1b. In this case, the semiconductor fins 210 may represent the remaining portions of a semiconductor layer formed on the buried insulating material. It should be appreciated that the principles disclosed herein may be readily applied to SOI architectures and bulk architectures, wherein during the further description it is referred to as bulk architecture in which the semiconductor fins 210 are provided in an upper portion of the semiconductor layer 203. In other words, the semiconductor fins 210 may be defined on the basis of recesses 203v formed in the semiconductor layer 203 and having an appropriate depth and width so as to appropriately define the lateral and vertical dimensions of the semiconductor fins 210. Moreover, in this manufacturing stage, a mask 240, for instance comprising a first mask material 240a and a second mask material 240b, may be provided and may be used for patterning the semiconductor layer 203.

The semiconductor device 200 as shown in FIG. 2e may be formed on the basis of process strategies including sophisticated deposition and lithography techniques in order to provide the mask material 240 and patterning the same so as to obtain mask features having appropriate lateral dimensions in order to define the recesses 203v and thus the semiconductor fins 210. Thereafter, based on the mask 240, the recesses 203v may be formed on the basis of well-established etch techniques, for instance by using etch techniques as are also applied when forming shallow trench isolations, as is well established in the art. Thereafter, the recesses 203v may be filled with a dielectric material, wherein at least a portion thereof may be provided in a form of a highly stressed material so as to induce a desired type of strain in the semiconductor fins 210. To this end, any well-established deposition recipes may be applied, wherein as discussed above, many process technologies are available in which a high stress level may be obtained upon deposition and/or during a subsequent treatment of the material as deposited. For example, silicon nitride may be deposited on the basis of plasma enhanced deposition recipes with a high internal stress level, wherein tensile or compressive strain levels may be readily adjusted upon selecting appropriate deposition parameters. Similarly, silicon dioxide may be deposited on the basis of process parameters with high internal compressive stress, while in other cases a high tensile stress may be obtained by post-treating a silicon dioxide material, for instance removing moisture and the like, which may intentionally be incorporated during the deposition of the silicon oxide material.

Figure 2F:
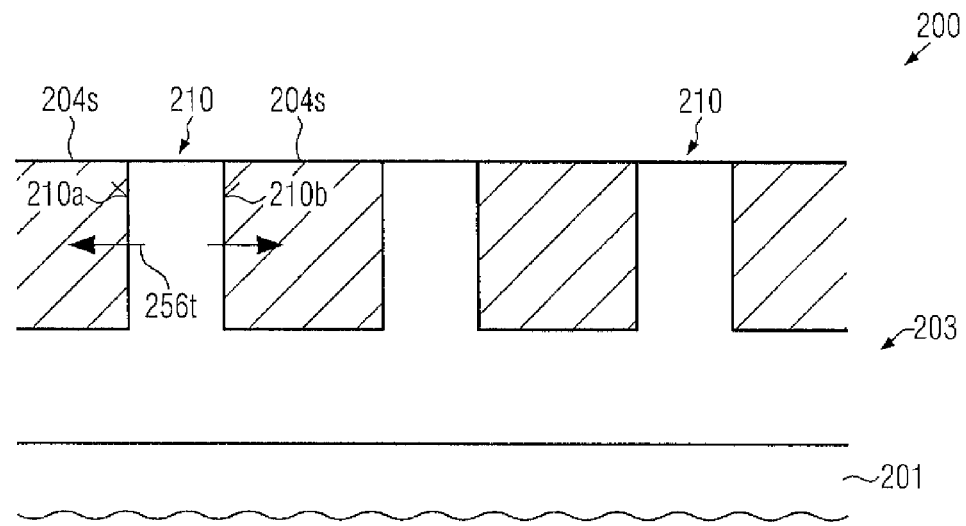

FIG. 2f schematically illustrates the semiconductor device 200 in a further advanced manufacturing stage. As illustrated, the strain-inducing isolation material 204s may be provided so as to connect to the sidewall surface areas 210a, 210b of the semiconductor fins 210, thereby inducing a desired type of strain in the semiconductor fins 210 in this manufacturing stage. In the embodiment shown, the isolation material 204s may be provided with an internal stress level that is appropriate for using a tensile strain component 256t in the semiconductor fins 210. In other cases (not shown), the material 204s may be provided so as to induce a compressive strain component. In the embodiment shown, the isolation material 204s extends along the entire height of the semiconductor fins 210, while in other cases any other appropriate height level of the material 204s may be implemented or a height level thereof may be adjusted in a later manufacturing stage, for instance locally or globally, prior to or after providing a gate electrode structure.

The device 200 as shown in FIG. 2f may be formed on the basis of the process sequence as described above, wherein, after providing the isolation material 204s, any excess portion may be removed, for instance by etching, chemical mechanical polishing (CMP) and the like, wherein, for instance, the mask material 240b (FIG. 2e) may be used as a stop material. In this manufacturing stage, a desired height level of the material 204s may be adjusted, for instance, by selectively removing material thereof on the basis of an etch process, while also using the mask material as an etch mask. Next, the mask layer 240 (FIG. 2e) may be removed in order to obtain the configuration as shown in FIG. 2f. It should be appreciated that any surface non-uniformities, such as recessed corner areas of the isolation material 204s, which may possibly be created during the previous processing, may be compensated for by depositing a further portion of the material and removing any excess portion thereof by planarization techniques in order to obtain a desired planar surface topography.

Figure 2G:
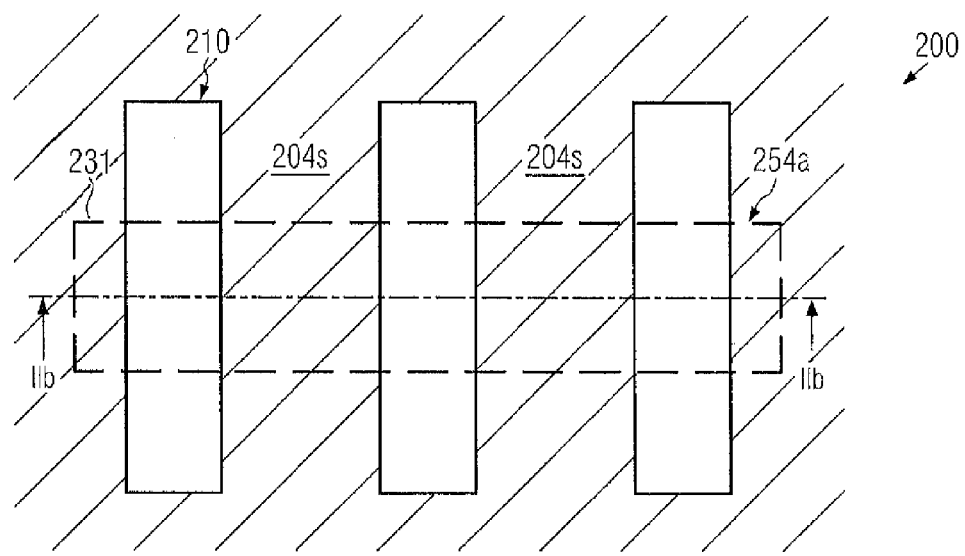

FIG. 2g schematically illustrates the device 200 in a manufacturing stage in which a local recessing of the isolation material 204s may be applied in the channel area 254a which may be accomplished, for instance, by providing an appropriate mask 231 in the form of any appropriate hard mask material and the like. Consequently, the mask 231 may basically define the lateral position and the size of a gate electrode structure to be formed on or in the channel area 254a. To this end, any appropriate material or materials may be deposited and may be patterned so as to provide the mask 231 having an opening that corresponds to the lateral size and position of a gate electrode structure, or at least a portion thereof, for instance, since any sidewall spacer structures may be formed in a later manufacturing stage. It should be appreciated that the lateral size of the mask opening 231 may finally be determined on the basis of deposition processes in combination with anisotropic etch processes, thereby extending the capabilities of presently available lithography techniques.

Figure 2H:
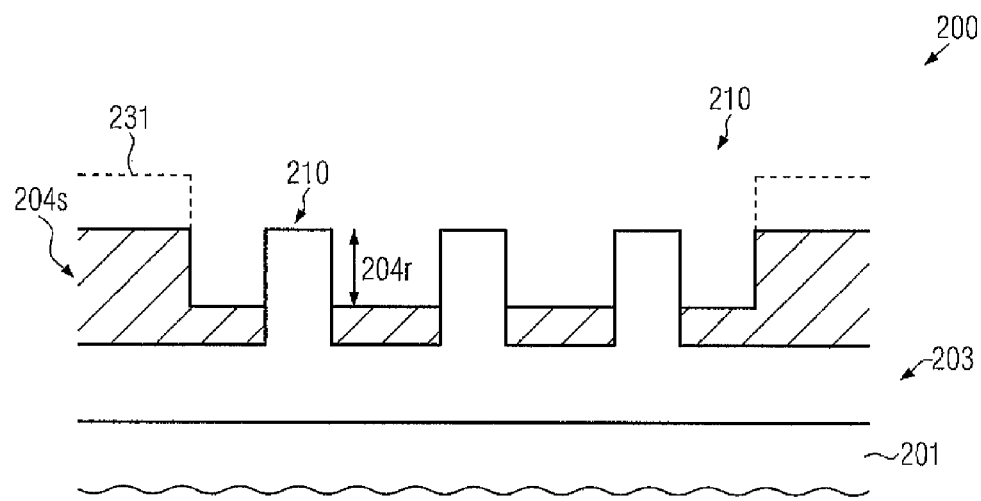

FIG. 2h schematically illustrates a cross-sectional view of the device 200 along the section IIb of FIG. 2g. As illustrated, on the basis of the etch mask 231, an etch process may be performed so as to remove at least a portion of the isolation material 204s, which may be accomplished by applying highly selective etch recipes. For example, silicon dioxide material may be removed selectively with respect to silicon material on the basis of a plurality of well-established wet chemical and plasma assisted etch recipes. Similarly, silicon nitride material may be efficiently removed selectively with respect to silicon on the basis of well-established plasma assisted or wet chemical etch recipes. In this case, the mask 231 may also be provided on the basis of any appropriate material that allows a selective removal of a portion of the material 204s. In the embodiment shown, the depth of the recess 204r and thus the electrically effective height of the semiconductor fins 210 in the channel area may be re-adjusted by appropriately controlling the corresponding etch process, while in other cases the exposed portion of the material 204s may be substantially completely removed laterally adjacent to the semiconductor fins 210, if considered appropriate for the overall configuration of the semiconductor device 200. On the basis of the device configuration shown, in some illustrative embodiments, appropriate gate materials may be deposited, wherein the mask 231 may also act as an efficient deposition mask. That is, appropriate dielectric materials, such as silicon dioxide, silicon oxynitride and the like, may be deposited or may be formed on the basis of any appropriate process strategy, for example by oxidation and/or any further surface treatment, followed by the deposition of one or more electrode materials, such as silicon, silicon/germanium and the like. It should be appreciated that, in some illustrative embodiments, the deposition of gate materials may also include the deposition of sophisticated dielectric materials, such as high-k dielectric materials, as discussed above, possibly in combination with conventional dielectric materials, depending on the overall device requirements. In this case, also appropriate cap materials, such as metal-containing materials in the form of titanium nitride and the like, may be provided, possibly in combination with a work function metal species when an adjustment of the overall electronic characteristics of gate electrode structures may be required in this manufacturing stage.

Figure 2I:
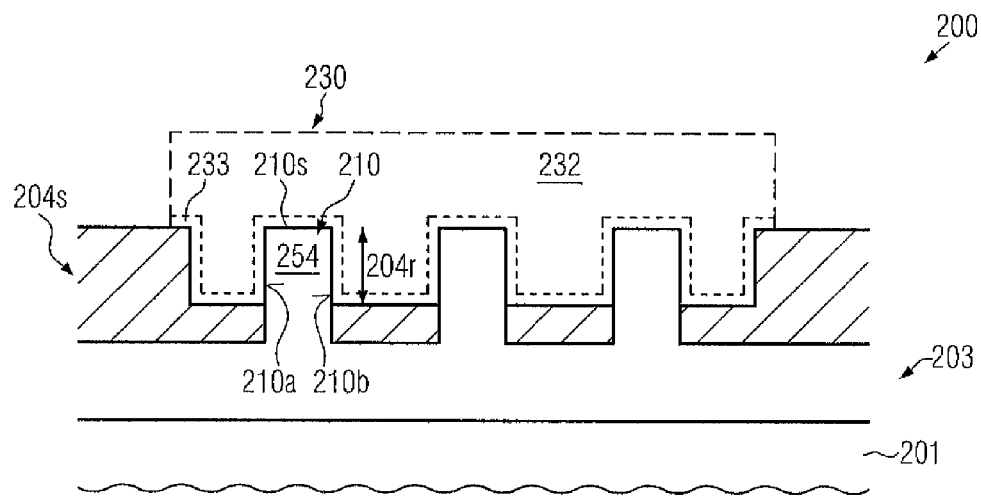

FIG. 2i schematically illustrates a cross-sectional view of the device 200 with the gate electrode structure 230 formed above a central portion of the semiconductor fins 210 on the basis of the previously adjusted recesses 204r. The gate electrode structure 230 may thus comprise a gate dielectric material 233 and at least one electrode material 232. Moreover, the height and the lateral dimension of the gate electrode structure 230 may be substantially determined by the mask 231 (FIG. 2h), which may be removed on the basis of any appropriate selective etch recipe. Consequently, the gate electrode structure 230 may form a tri-gate architecture with the central portions of the semiconductor fins 210 since control of the current flow within the semiconductor fins 210 in a portion that corresponds to the channel region may be controlled via the sidewall surface areas 210a, 210b and the top surface 210s. It should be appreciated that the electrically effective height of the semiconductor fins 210 in the channel region 254 may be influenced by the degree of recessing 204r in combination with the dopant profile still to be provided in the semiconductor regions 210 in the drain and source regions areas. Furthermore, the isolation material 204s may provide the desired strain in the semiconductor fins 210, at least outside the channel region 254, thereby, however, also efficiently contributing to superior transistor characteristics, as will be described later on.

Figure 2J:
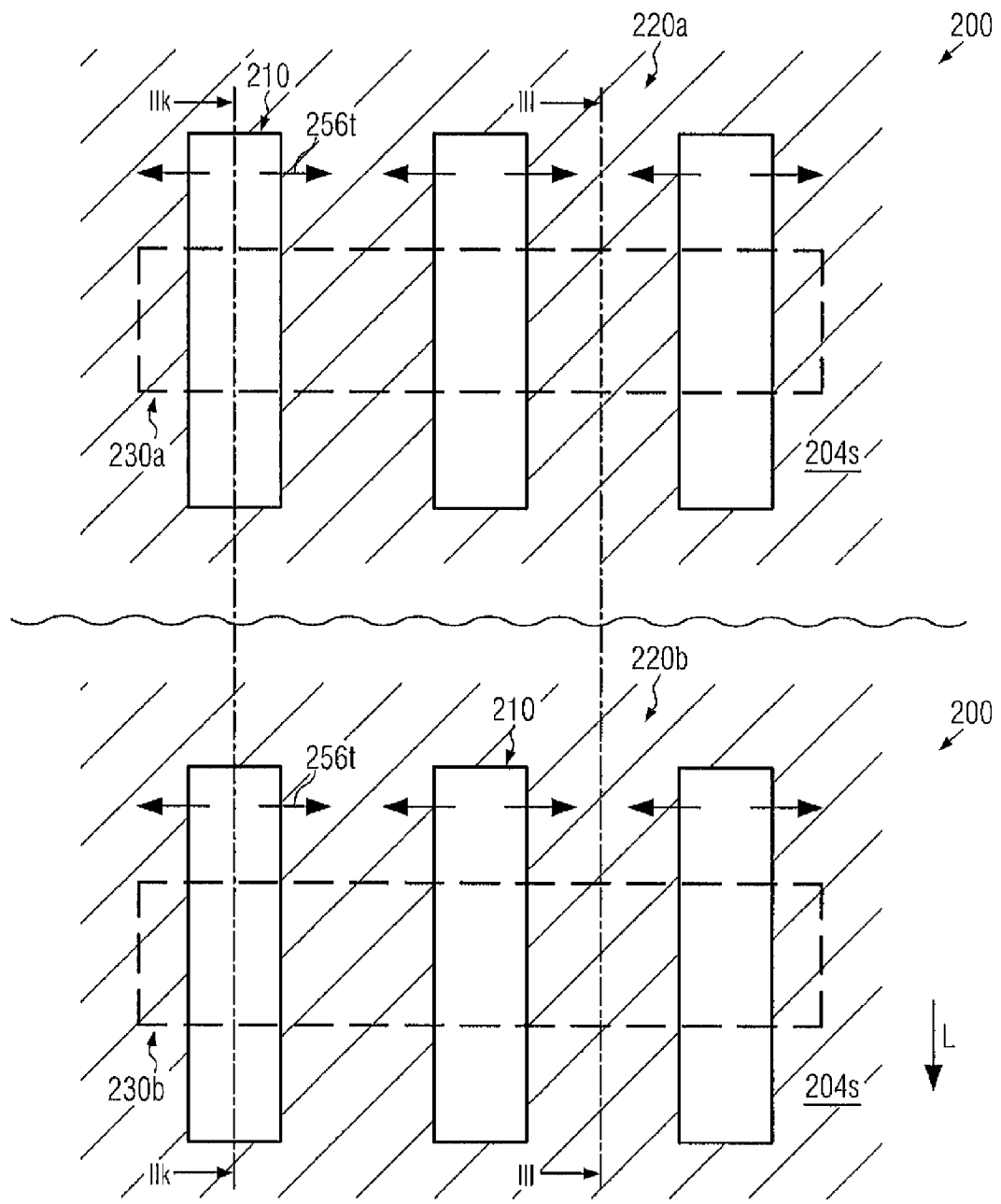
FIGS. 2j-2l schematically illustrate a top view and cross-sectional views, respectively, of the semiconductor device during various manufacturing stages in which different transistors may be provided on the basis of the same strain-inducing isolation material, according to still further illustrative embodiments.

FIG. 2j schematically illustrates a top view of the semiconductor device 200 according to illustrative embodiments in which a first transistor 220a and a second transistor 220b may be provided so as to differ in their conductivity type, while the same type of isolation material 204s may be applied for both transistors. As shown, the first transistor 220a may comprise the semiconductor fins 210 with any appropriate number so as to adjust the overall current drive capability, wherein a corresponding gate electrode structure 230a, which may have the same configuration as described above with reference to the gate electrode structure 230 (FIG. 2i) provides the current flow control as required. Furthermore, at least laterally outside the gate electrode structure 230a, the strain-inducing isolation material 204s may be provided and may induce a certain type of strain 256t, which in one illustrative embodiment may be provided as a tensile strain. Similarly, the second transistor 220b may comprise the semiconductor fins 210 with an appropriate lateral dimension and with a number to comply with the required current drive capabilities. Furthermore, a gate electrode structure 230b, which may have basically the same configuration as the gate electrode structure 230 (FIG. 2i), may be provided so as to provide the current flow characteristics required for the transistor 220b. It should be appreciated that the gate electrode structures 230a, 230b may differ in their characteristics, for instance in terms of a work function metal species and the like, if a sophisticated high-k metal gate electrode structure is to be implemented, the isolation material 204s may thus also induce the same type and substantially the same magnitude of strain in the semiconductor fins 210, as indicated by 256t. Hence, in this embodiment, the same type of strain 256t, substantially acting perpendicular to the length direction L, results in a superior performance of both the transistor 220a and the transistor 220b, although these transistors are of different conductivity type. For example, the transistor 220a may represent an N-channel transistor, while the transistor 220b may represent a P-channel transistor, while nevertheless obtaining superior performance characteristics on the basis of the same strain component 256t, as will be discussed later on with reference to FIGS. 4-6.

Figure 2K:
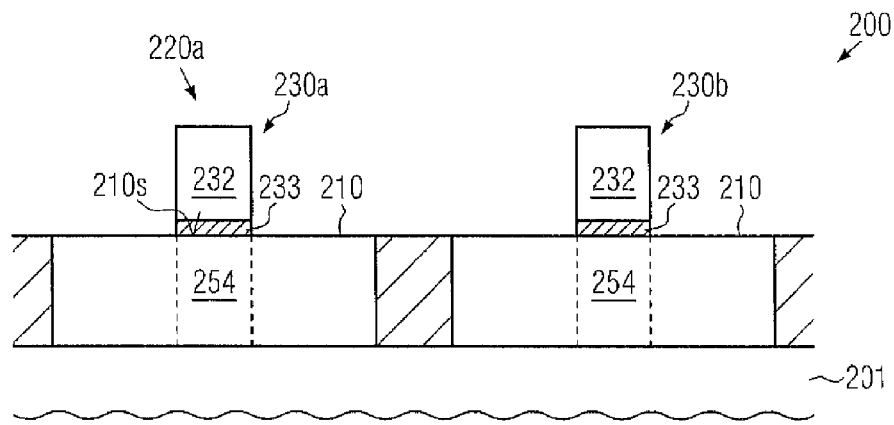

FIG. 2k schematically illustrates a cross-sectional view of the device 200 along the section line IIk of FIG. 2j. As shown, the gate electrode structure 230a may be formed on the semiconductor fin 210 in the transistor 220a and may thus act on the channel region 254 via the surface 210s covered by the gate electrode structure 230a. Similarly, the gate electrode structure 230b may be formed above the central portion of the semiconductor fin 210 and may thus also control current flow in the channel region 254 through the surface 210s, while at the same time an efficient current control of the channel region 254 may also be obtained from sidewall surface areas of the semiconductor fins 210, as indicated by the dashed line, as is also discussed above.

Figure 2L:
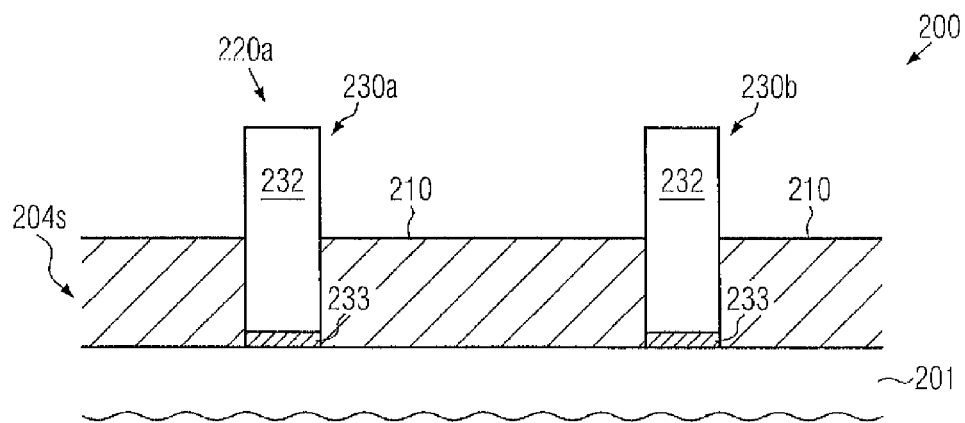

FIG. 2l schematically illustrates a cross-sectional view of the semiconductor device 200 according to the section line III in FIG. 2j. Consequently, in this section, the gate electrode structures 230a, 230b are formed in the strain-inducing isolation material 204s, wherein, in the embodiment shown, the gate electrode structures 230a, 230b may substantially extend through the entire material 204s, while in other cases, as previously discussed, a portion of the material 204s may be preserved below the gate electrode structures 230a, 230b, if considered appropriate. For example, a corresponding configuration is shown in FIG. 2i. Hence, in this configuration a significant component of strain may be induced by the material 204s in a direction perpendicular to the drawing plane of FIG. 2l, thereby contributing to superior performance characteristics of the transistors 220a, 220b of different conductivity type.

It should be appreciated that, based on the device configuration as, for instance, shown in FIG. 2l, the further processing may be continued by well-established process strategies, for instance incorporating drain and source dopant species, forming sidewall spacer structures on the gate electrode structures 230a, 230b, performing anneal processes and the like, as is, for instance, also described above with reference to conventional planar transistor configurations. Consequently, the process techniques described herein provide a high degree of compatibility with respect to conventional process techniques and also enable hybrid configurations in which planar transistors and three-dimensional transistors have to be implemented into the same semiconductor device.

Furthermore, in the above-described process techniques, the gate electrode structures may be provided in an early manufacturing stage so as to have substantially the final electronic characteristics so that the further processing, i.e., providing the drain and source regions, possibly in combination with incorporating a strain-inducing semiconductor alloy, such as a silicon/germanium material and the like, may be applied in the presence of the gate electrode structure having substantially their final configuration.

In other illustrative embodiments, as will be described with reference to FIGS. 3a-3f, the gate electrode structures may be provided in the form of a preliminary structure and the final characteristics thereof may be adjusted in a later manufacturing stage on the basis of a so-called replacement gate approach.

Figure 3A:
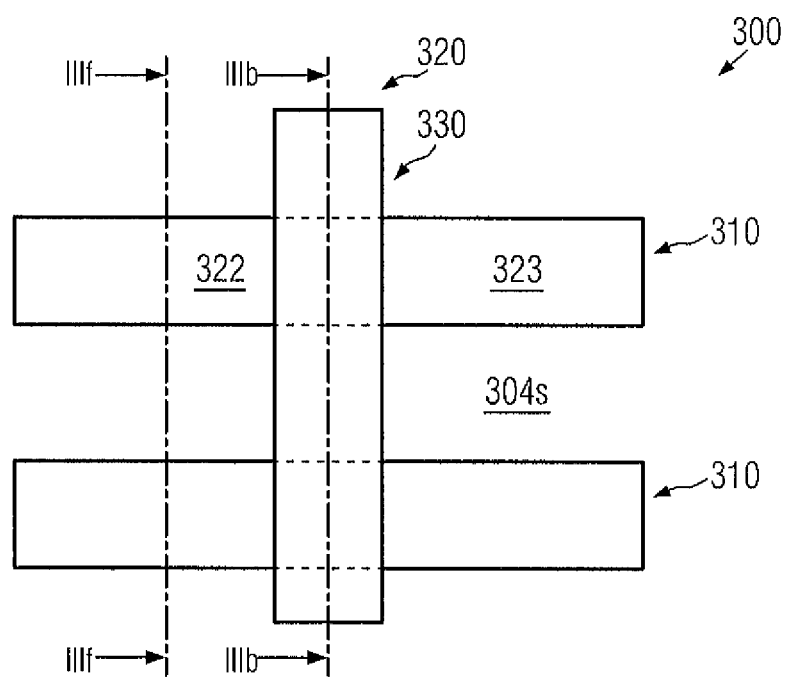
FIGS. 3a-3f schematically illustrate a top view and cross-sectional views, respectively, of a semiconductor device during various manufacturing stages in forming a three-dimensional transistor architecture on the basis of a replacement gate approach and a strain-inducing isolation material provided between semiconductor fins, according to still further illustrative embodiments.

FIG. 3a schematically illustrates a top view of a semiconductor device 300 comprising a transistor 320 having a three-dimensional configuration. The device 300 may be illustrated in a very advanced manufacturing stage in which a gate electrode structure 330 with a non-final configuration may be formed above one or more elongated semiconductor bodies or semiconductor fins 310, in which drain regions 322 and source regions 323 may be implemented. Furthermore, a strain-inducing isolation material 304s may be provided laterally adjacent at least to the drain and source regions 322, 323 in order to induce a specific type of strain, as discussed above.

Figure 3B:
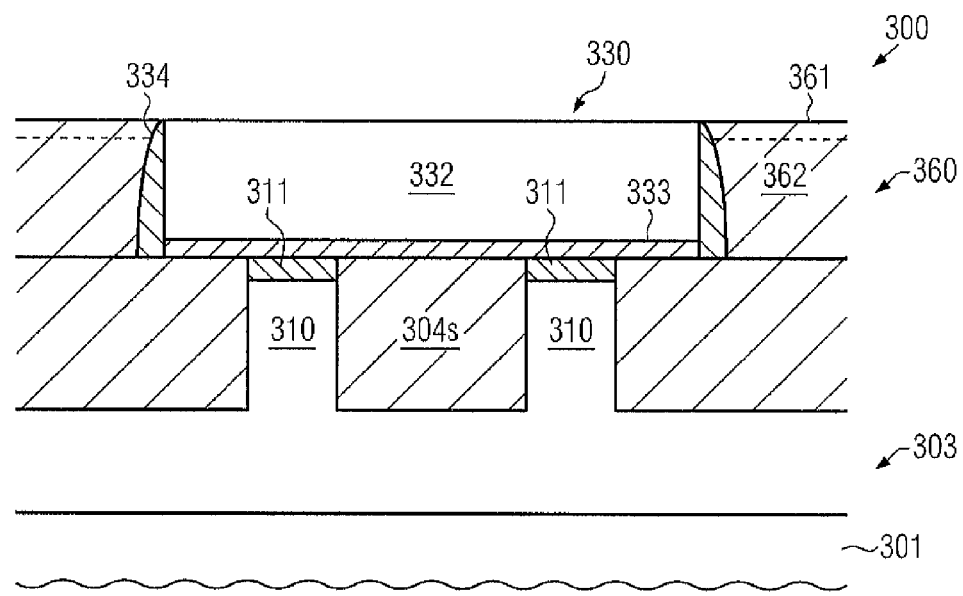

FIG. 3b schematically illustrates a cross-sectional view of the semiconductor device 300 along the section line IIIb of FIG. 3a. As illustrated, the device 300 may comprise a substrate 301 and a semiconductor layer 303 in which the semiconductor fins 310 are formed so as to have appropriate lateral dimensions and having an appropriate height, as is, for instance, also discussed above with reference to the semiconductor device 200. With respect to the layer 303 and the substrate 301, in view of SOI architectures, bulk architectures and the like, the same criteria apply as previously discussed with reference to the device 200. Furthermore, the semiconductor fins 310 are laterally embedded in the strain inducing isolation material 304s, which thus acts on at least a portion of the sidewall areas of the semiconductor fins 310, as is also discussed above with reference to the semiconductor device 200. Furthermore, the gate electrode structure 330 may be provided above a portion of the semiconductor fins 310 and may comprise a dielectric material 333, such as a silicon dioxide material and the like, followed by a material 332, wherein at least the material 332 may be considered as a placeholder material that is to be removed in a later manufacturing stage. As will be evident from the following description, in some illustrative embodiments, also the material 333 may be removed and may thus be considered as a part of a placeholder material. Furthermore, a sidewall spacer structure 334 may be provided on sidewalls of the gate electrode structure 330. To this end, any well-established dielectric materials may be used. Furthermore, a contact level 360 may be provided, at least partially, on the basis of one or more dielectric materials 362, which thus laterally encloses the gate electrode structure 330 and also passivates other device areas, such as the drain and source regions 322, 323 (FIG. 3a). In some illustrative embodiments, the dielectric material 362 may be provided in the form of a material having appropriate etch stop capabilities with respect to the further processing, while in other cases at least a surface layer 361 may be provided so as to allow selective removal of the material 304s in a further advanced manufacturing stage. For example, the surface layer 361 may be provided in the form of a silicon dioxide based material in which a nitrogen species has been incorporated so as to enhance etch resistivity in view of moving silicon dioxide material when the isolation material 304s is provided in the form of a silicon dioxide material.

Furthermore, a mask layer 311, such as a silicon nitride material and the like, may be formed on the semiconductor fins 310 and may thus impart superior etch resistivity to the fins 310 upon recessing the material 304s in a later manufacturing stage.

The semiconductor device as shown in FIGS. 3a and 3b may be formed on the basis of any appropriate process strategy, as for instance also described above with reference to the semiconductor device 200, in order to form the semiconductor fins 310 and the gate electrode structure 330. It should be appreciated, however, that the mask layer 311 may have been used in patterning the semiconductor fins 310, as is for instance previously explained with reference to the mask material 240 (FIG. 2e), while in other cases a dedicated mask material may be provided. Moreover, after forming the gate electrode structure 330, any additional process steps may be applied in order to form the drain and source regions 322, 323 (FIG. 3a), which may include appropriate implantation processes, selective epitaxial growth techniques and the like, possibly in combination with appropriate anneal techniques, wherein, if required, metal silicide may be provided in the drain and source areas. Thereafter, the dielectric layer 362 may be formed, for instance by any appropriate deposition technique, wherein any excess material may be efficiently removed, for instance by CMP and the like. If required, the surface layer 361 may be formed, for instance by a surface treatment such as thermal or plasma assisted nitridation processes and the like. It should be appreciated that upon removing any excess material of the contact level 360, also a surface of the placeholder material 332 may be exposed, wherein any appropriate process strategy may be applied.

Figure 3C:
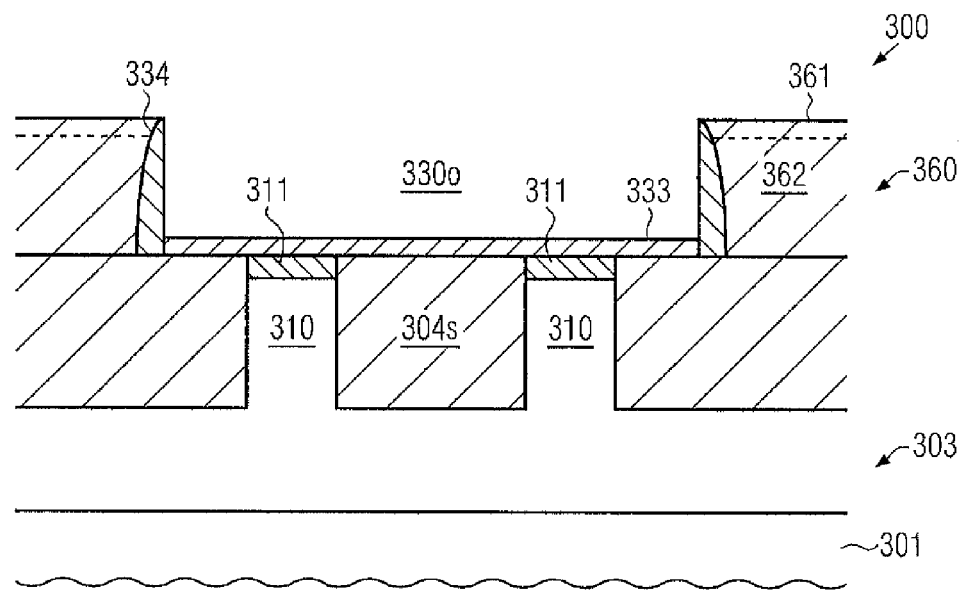

FIG. 3c schematically illustrates the semiconductor device 300 in a further advanced manufacturing stage. As shown, a gate opening 330o may be formed by removing the placeholder material 332 (FIG. 3b), possibly in combination with the dielectric material 333. To this end, well-established plasma assisted or wet chemical etch recipes may be applied so as to remove the material 332 of FIG. 3b, wherein the material 333 may act as an etch stop layer. Thereafter, the material 333 may be removed by applying any well-established wet chemical etch recipes, while the mask layers 311 may preserve integrity of the semiconductor fins 310. Thereafter, a further etch process may be applied such as a plasma assisted etch recipe in order to recess an exposed portion of the isolation material 304s so as to obtain a three-dimensional configuration in the exposed portion of the semiconductor fins 310, while using the layer 311 as an efficient etch mask. Furthermore, the material 361 may preserve integrity of the material 362, if this material does not provide a high degree of etch resistivity with respect to an etch recipe for removing the material 304s, as discussed above.

Figure 3D:
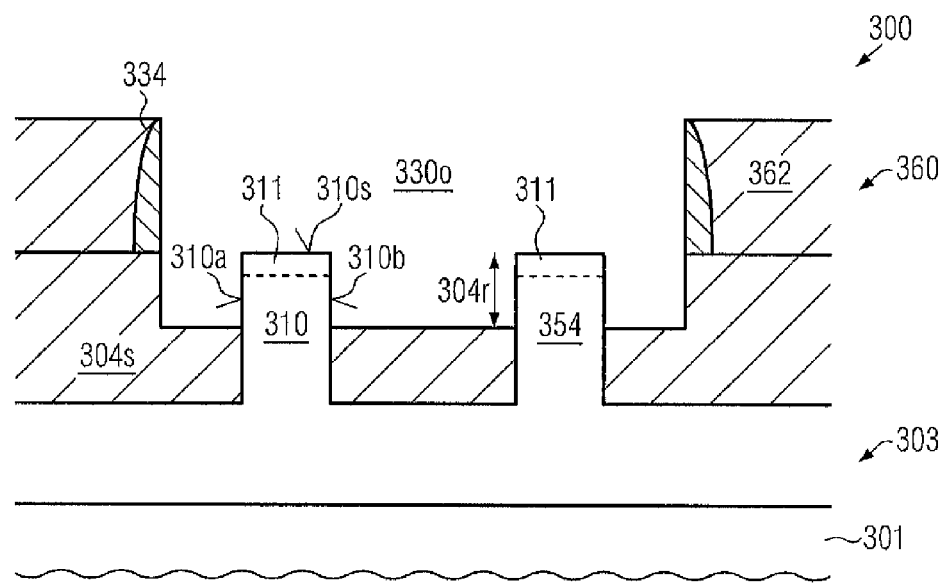

FIG. 3d schematically illustrates the device 300 with a recess 304r formed in the isolation material 304s, which may be accomplished by using any well-established etch technique. Thereafter, the mask layer 311 may be removed, which may also be accomplished by wet chemical etch recipes and the like. Hence, the semiconductor fins 310 may thus have an exposed top surface 310s and exposed sidewall surface areas 310a, 310b, which may thus define a three-dimensional configuration of the channel region 354 in the semiconductor fins 310. It should be appreciated that the desired degree of recessing 304r may be readily determined on the basis of the process parameters of the etch process for removing a portion of the material 304s. For example, if desired, the exposed portion of the material 304s may be removed along the entire height of the semiconductor fins 310, if considered appropriate.

Figure 3E:
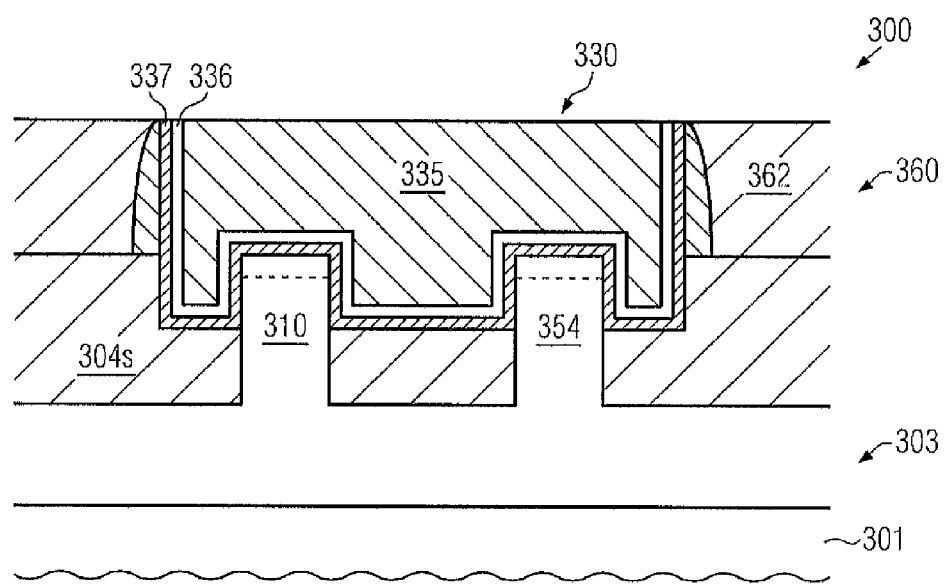

FIG. 3e schematically illustrates the device 300 in a further advanced manufacturing stage. As shown, the gate electrode structure 330 may now be provided in the form of a high-k metal gate electrode structure comprising a gate dielectric material 337, possibly in combination with a metal-containing material 336 for adjusting the work function, followed by highly conductive electrode metal 335, for instance in the form of aluminum, aluminum alloys and the like. The materials 337, 336 and 335 may be provided on the basis of any appropriate deposition technique, such as chemical vapor deposition (CVD), atomic layer deposition (ALD) and the like, for the materials 337 and/or 336, while typically the material 335 may be provided by CVD, electrochemical deposition techniques and the like. Thereafter, the processing may be continued by removing any excess portion thereof, which may be accomplished by CMP and the like.

Figure 3F:
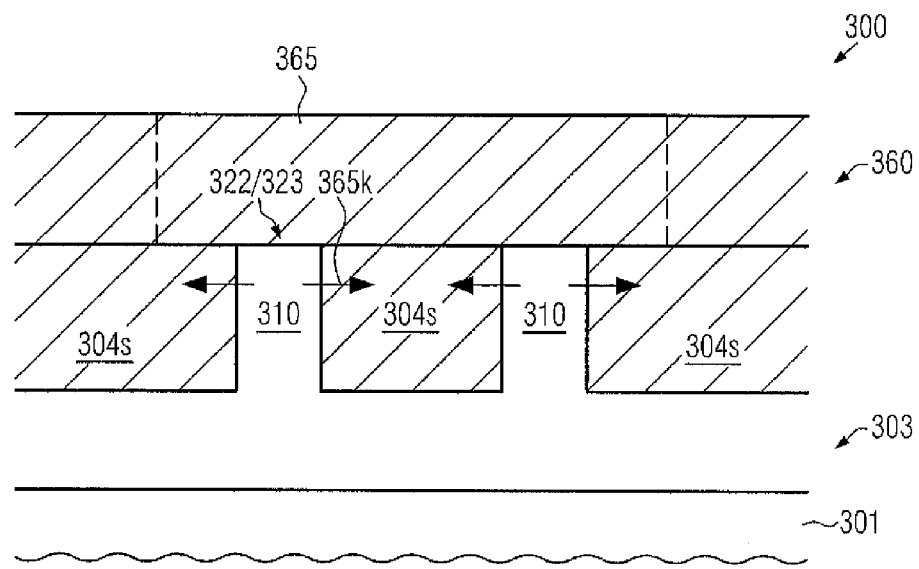

FIG. 3f schematically illustrates a cross-sectional view of the semiconductor device 300 along the section line IIIf of FIG. 3a. As shown, the semiconductor fins 310, i.e., the portions thereof corresponding to the drain and source regions 322, 323 are laterally embedded in the strain-inducing isolation material 304s, thereby inducing a desired type of strain therein, which is, in the embodiment shown, indicated as a tensile strain component 365k. It should be appreciated, however, that in other cases a compressive strain component may be induced by appropriately providing the isolation material 304s. It should be appreciated that the semiconductor fins 310 corresponding to the drain and source regions 322 and 323 have incorporated therein an appropriate dopant species with a desired dopant profile so as to comply with the overall transistor characteristics of the device 300. For convenience, any such dopant species are not shown in FIG. 3f. Furthermore, as also indicated above, the drain and source regions 322, 323 may comprise a strain-inducing semiconductor alloy, as for instance previously discussed with reference to the semiconductor device 100 of FIG. 1a. In some illustrative embodiments, as shown in FIG. 3f, the individual portions of the semiconductor fins corresponding to the drain region 322 and the source region 323, respectively, may be electrically connected by means of a contact structure 365 to be formed in the contact level 360 during the further processing. In other cases, the end portions of the semiconductor fin 310 may be connected by semiconductor material (not shown).

As a consequence, providing the strain-inducing isolation material 304s may also be compatible with replacement gate approaches, wherein, as also discussed above with reference to the device 200, the same type of strain-inducing isolation material may be used for transistors of different conductivity type, while in other cases the isolation material 304s may be provided with different strain characteristics for different transistors, depending on the overall device requirements and the basic crystallographic configuration of the base semiconductor material.

Figure 4:
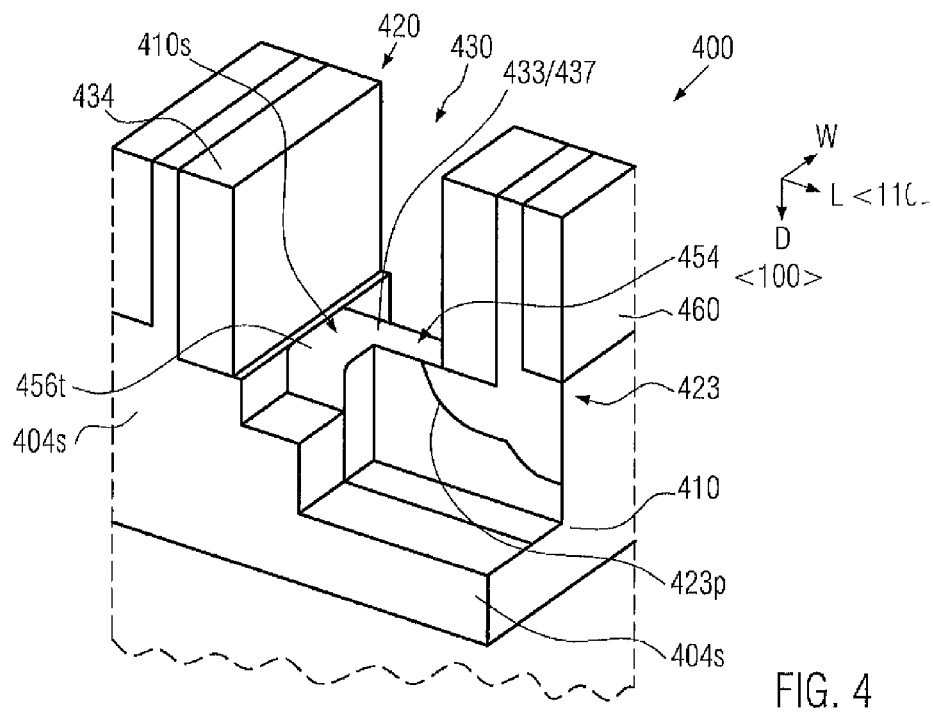
FIG. 4 schematically illustrates a perspective view of a three-dimensional transistor wherein the strain conditions are illustrated, which may be obtained on the basis of a strain-inducing isolation material acting on sidewalls of a semiconductor fin, according to illustrative embodiments.

FIG. 4 schematically illustrates a perspective view of a semiconductor device 400 comprising a three-dimensional transistor 420, which may have substantially the same configuration as transistors described above with reference to the semiconductor devices 200 and 300. As shown, the transistor 420 may comprise a plurality of semiconductor fins 410 or elongated semiconductor bodies wherein, for convenience, only one of these semiconductor fins is illustrated in FIG. 4. Moreover, a gate electrode structure 430 may be formed above and around a central portion of the semiconductor fin 410 so as to allow control of current flow through a channel region 454 between a source region 423 and a drain region (not shown), as is also discussed above. For convenience, a corresponding electrode material of the gate electrode structure 430 is not shown in FIG. 4. Moreover, the gate electrode structure 430 may comprise a sidewall spacer structure 434 and a gate dielectric material 433, for instance in the form of a conventional dielectric material, while in other cases a high-k dielectric material 437 may be provided, as is also discussed above. Furthermore, the gate electrode structure may be laterally embedded in a contact level 460, as is for instance discussed above with reference to the semiconductor device 300. Furthermore, a strain-inducing isolation material 404s may be provided so as to laterally act at least on the semiconductor fin 410 in the drain and source regions, as is also explained above. It should be appreciated that, for convenience, a portion of the semiconductor fin 410 corresponding to the source region 423 and to a part of the channel region 454 is omitted in the illustration in order to demonstrate the strain conditions in the semiconductor fin 410 obtained on the basis of the strain-inducing isolation material 404s. As indicated, the strain component that is oriented perpendicular to a length direction L is quantitatively illustrated in FIG. 4. That is, a strain component is considered that extends along a width direction W which is substantially present in the drain and source areas, while also a pronounced degree of strain may be observed at and in the vicinity of PN junctions 423p. For example, as indicated, the strain component 456t may thus also be present at a surface layer 410s of the semiconductor fin 410 and may extend into the channel region 454, thereby providing superior strain conditions at and in the vicinity of the channel region 454, and in particular at the top surface 410s. Consequently, although the strain component 456t may not necessarily extend deeply along the depth direction D at and in the vicinity of the channel region 454, nevertheless superior transistor performance may be achieved. As discussed above, in some illustrative embodiments, the same type of stressed isolation material may be applied for transistors of different conductivity type, i.e., P-channel transistors and N-channel transistors having a three-dimensional configuration, while still obtaining superior performance for both types of transistors. For example, in some illustrative embodiments, the basic crystallographic configuration of the semiconductor material may be selected such that, in combination with the orientation of the transistor devices, the crystallographic axis corresponding to the length direction or current flow direction may differ from the crystallographic orientation corresponding to the top surface 410s of the semiconductor fin 410. For example, in one illustrative embodiment, the current flow direction may correspond to a crystallographic axis (110) or a physically equivalent orientation, while the top surface 410s may be a (100) crystal plane corresponding to a crystallographic axis perpendicular to this plane that is a (100) axis or a physically equivalent axis. For example, in this case, the crystallographic orientation may be a (100) orientation along the depth direction D.

It should be appreciated, however, that any other crystallographic configuration may be used in the geometry of the transistor 420, for instance by providing different types of strain-inducing isolation material or selecting any appropriate other crystallographic configuration in which performance enhancement may be obtained for P-channel transistors and N-channel transistors at the same time.

Figure 5:
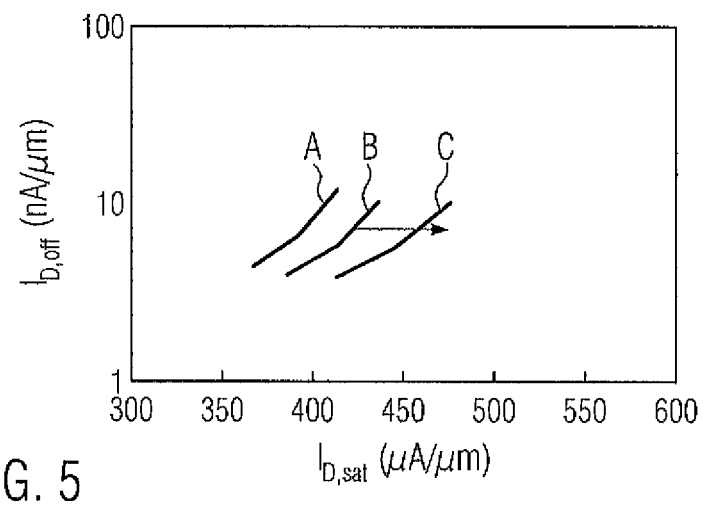
FIGS. 5 and 6 schematically illustrate simulation data for evaluating the electrostatic performance of an N-channel transistor (FIG. 5) and a P-channel transistor (FIG. 6) when receiving the same type of strain-inducing isolation material, according to illustrative embodiments.

FIG. 5 schematically illustrates results of the electrostatic behavior of a three-dimensional transistor, for instance the transistor 420 of FIG. 4, wherein curve A represents the off current versus the saturation current for an N-channel transistor, wherein the strain-inducing isolation material is provided with a compressive stress of approximately 1 GPa. Curve B represents the same transistor with a substantially stress neutral isolation material, while curve C indicates the transistor characteristic for tensile-stressed isolation material. As indicated, significant improvement may be obtained with respect to the isolation material having neutral stress conditions.

Figure 6:
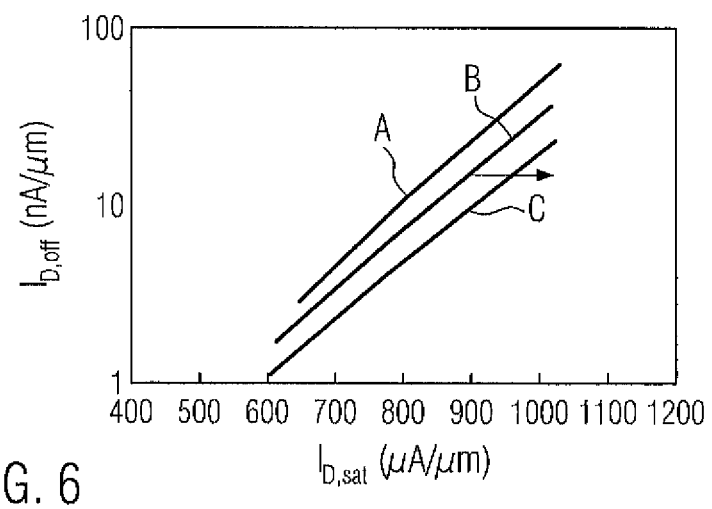

FIG. 6 schematically illustrates the results for a P-channel transistor in which the same strain-inducing isolation material is provided as in the transistor corresponding to FIG. 5. As shown, the compressive stress in the isolation material corresponding to curve A may result in a degradation of transistor characteristics compared to an isolation material of neutral stress conditions, indicated by curve B. On the other hand, significant improvement of transistor characteristics may be obtained on the basis of a tensile-stressed isolation material. It should be appreciated that the above results are obtained for a crystallographic configuration and a geometric orientation of the transistor that corresponds to the transistor 420 as shown in FIG. 4. Thus, a single strain-inducing mechanism provided on the basis of the isolation material having a high internal tensile stress level may result in significant improvement of transistor characteristics for N-channel transistors and P-channel transistors.

As a result, the present disclosure provides manufacturing techniques and semiconductor devices in which a three-dimensional transistor architecture may be implemented in which a plurality of elongated semiconductor bodies may have exposed sidewall surface areas, which may be in contact with a stressed isolation material. In this manner, a significant strain component may be induced perpendicular to the length direction of the semiconductor bodies, which, however, may have a significant influence on the overall transistor characteristics. In some illustrative embodiments, the same internally stressed isolation material may provide transistor performance enhancement for P-channel transistors and N-channel transistors.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a transistor device, comprising:
   forming at least one semiconductor fin in a drain area and a source area of a semiconductor region of a transistor, said drain area and said source area being laterally separated by a channel area, said at least one semiconductor fin being elongated along a length direction and having sidewalls and a top surface;
   forming a strain-inducing isolation material laterally adjacent to at least a portion of sidewalls of said at least one semiconductor fin, said isolation material inducing a strain in said at least one semiconductor fin in said drain and source areas perpendicular to said length direction;
   forming a masking layer above said strain-inducing isolation material and said at least one fin, said masking layer having a gate-shaped opening corresponding to a lateral size of a gate electrode for said device, said gate-shaped opening being positioned above said channel area of said device;
   performing an etching process through said gate-shaped opening to remove at least a portion of said strain-inducing isolation material positioned below said gate-shaped opening in said masking layer and thereby expose at least a portion of said sidewalls of said at least one fin; and
   with said masking layer in position, performing at least one process operation through said gate-shaped opening to form at least a gate insulation layer and a gate electrode around said at least one fin.

2. The method of claim 1, wherein forming said at least one semiconductor fin comprises forming said at least one semiconductor fin so as to extend through said channel area.

3. The method of claim 1, wherein performing said etching process through said gate-shaped opening to remove at least a portion of said strain-inducing isolation material positioned below said gate-shaped opening comprises performing said etching process through said gate-shaped opening to remove substantially all of said strain-inducing isolation material positioned below said gate-shaped opening so as to thereby expose a surface of said semiconductor region.

4. The method of claim 1, wherein performing said etching process through said gate-shaped opening to remove at least a portion of said strain-inducing isolation material positioned below said gate-shaped opening comprises performing said etching process through said gate-shaped opening to remove less that an entirety of said strain-inducing isolation material positioned below said gate-shaped opening so as to thereby define a recessed surface of said strain-inducing isolation material positioned below said gate-shaped opening.

5. A method of forming a transistor device, comprising:
  forming at least one semiconductor fin in a drain area and a source area of a semiconductor region of a transistor, said drain area and said source area being laterally separated by a channel area, said at least one semiconductor fin being elongated along a length direction and having sidewalls and a top surface;
  forming a strain-inducing isolation material that is positioned within said channel area and laterally adjacent to at least a portion of sidewalls of said at least one semiconductor fin, said isolation material inducing a strain in said at least one semiconductor fin in said drain and source areas perpendicular to said length direction;
  forming a sacrificial gate structure above said strain-inducing isolation material and said at least one fin, said sacrificial gate structure being positioned above said channel region of said device;
  forming a sidewall spacer adjacent said sacrificial gate structure;
  forming a layer of insulating material adjacent said sidewall spacer;
  removing said sacrificial gate structure to thereby define a gate opening defined by said spacers that exposes an upper surface of said strain-inducing isolation material;
  performing an etching process through said gate opening to remove at least a portion of said strain-inducing isolation material positioned below said gate opening and thereby expose at least a portion of said sidewalls of said at least one fin; and
  forming final gate structure within said gate opening and around said at least one fin, said final gate structure comprising at least a gate insulation layer and a gate electrode.

6. The method of claim 5, wherein forming said at least one semiconductor fin comprises forming said at least one semiconductor fin so as to extend through said channel area.

7. The method of claim 5, wherein performing said etching process through said gate opening to remove at least a portion of said strain-inducing isolation material positioned below said gate opening comprises performing said etching process through said gate opening to remove substantially all of said strain-inducing isolation material positioned below said gate opening so as to thereby expose a surface of said semiconductor region.

8. The method of claim 5, wherein performing said etching process through said gate opening to remove at least a portion of said strain-inducing isolation material positioned below said gate opening comprises performing said etching process through said gate opening to remove less that an entirety of said strain-inducing isolation material positioned below said gate opening so as to thereby define a recessed surface of said strain-inducing isolation material positioned below said gate opening.

* * * * *